United States Patent
Bessho et al.

(10) Patent No.: US 11,762,035 B2
(45) Date of Patent: Sep. 19, 2023

(54) ABNORMALITY DETECTION METHOD AND ABNORMALITY DETECTION APPARATUS

(71) Applicants: Tokyo Electron Limited, Tokyo (JP); AVALDATA CORPORATION, Tokyo (JP)

(72) Inventors: Tomoya Bessho, Yamanashi (JP); Shiro Hayashi, Iwate (JP); Junichi Harada, Yamanashi (JP); Akitsugu Noguchi, Tokyo (JP)

(73) Assignees: Tokyo Electron Limited, Tokyo (JP); AVALDATA CORPORATION, Tokyo (JP)

( * ) Notice: Subject to any disclaimer, the term of this patent is extended or adjusted under 35 U.S.C. 154(b) by 0 days.

(21) Appl. No.: 17/804,663

(22) Filed: May 31, 2022

(65) Prior Publication Data
US 2022/0390525 A1 Dec. 8, 2022

(30) Foreign Application Priority Data
Jun. 8, 2021 (JP) .................................. 2021-095890

(51) Int. Cl.
*G01R 31/40* (2020.01)
*G01R 31/42* (2006.01)
*G01R 31/317* (2006.01)
*G01R 31/30* (2006.01)
*G01R 31/52* (2020.01)
*G01R 31/34* (2020.01)

(52) U.S. Cl.
CPC ........ *G01R 31/42* (2013.01); *G01R 31/3004* (2013.01); *G01R 31/31721* (2013.01); *G01R 31/40* (2013.01); *G01R 31/343* (2013.01); *G01R 31/52* (2020.01)

(58) Field of Classification Search
CPC .............. G01R 31/42; G01R 19/16528; G01R 19/16571; G01R 23/165; G01R 31/318519; G01R 31/40; G01R 31/31721; G01R 31/3004; G01R 31/52; G01R 31/343
USPC ......... 324/71, 378, 403, 415, 425, 500, 537, 324/764.01
See application file for complete search history.

(56) References Cited

U.S. PATENT DOCUMENTS

| | | | |
|---|---|---|---|
| 2007/0146169 A1* | 6/2007 | Otsuka | B62D 5/0487 341/15 |
| 2020/0256926 A1* | 8/2020 | Umezawa | G01R 31/42 |
| 2021/0006059 A1* | 1/2021 | Murata | H02H 3/04 |

FOREIGN PATENT DOCUMENTS

JP 2011-179849 9/2011

* cited by examiner

*Primary Examiner* — Raul J Rios Russo
(74) *Attorney, Agent, or Firm* — IPUSA, PLLC

(57) ABSTRACT

An abnormality detection method according to one aspect of the present disclosure is a method of detecting an abnormality in an AC signal to be input from an AC power supply. The method includes, where an ideal AC signal is represented as $V_0 \sin \omega t$ ($V_0$: amplitude, $\omega$: angular frequency, t: time), calculating an arithmetic value including a value represented by $\sin^2 \omega t + \cos^2 \omega t$ and determining that the AC signal is abnormal when the arithmetic value is out of a threshold range.

10 Claims, 5 Drawing Sheets

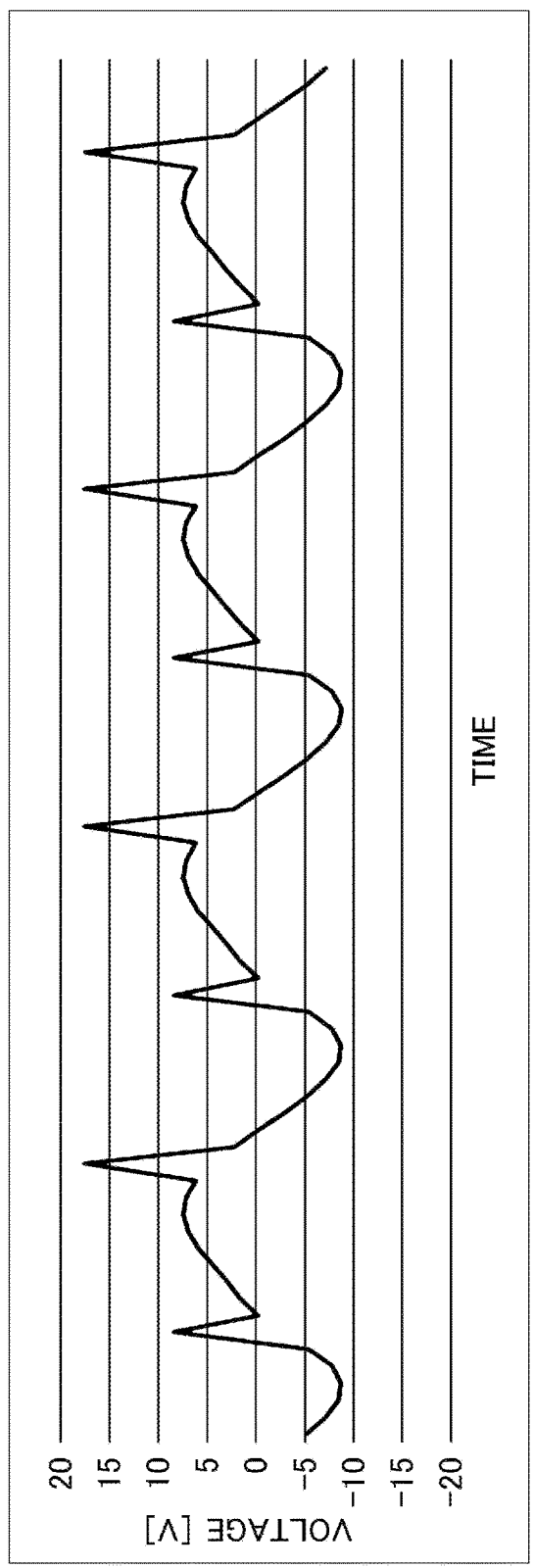
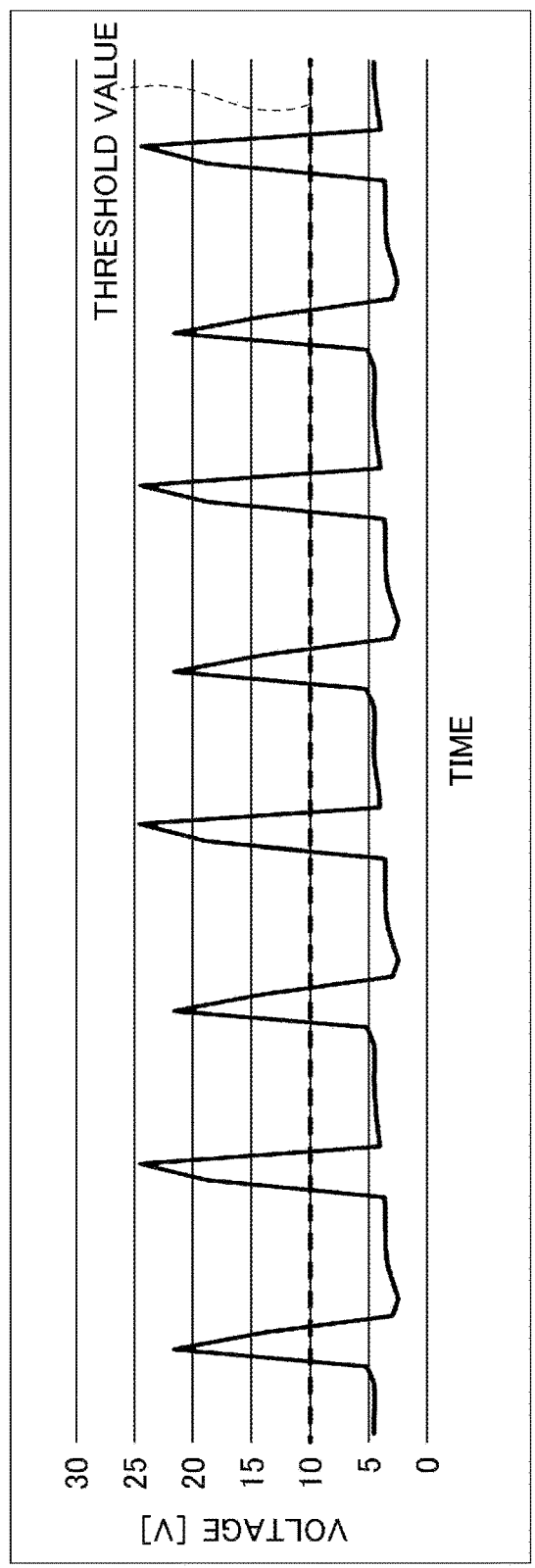
FIG.4A
FIG.4B

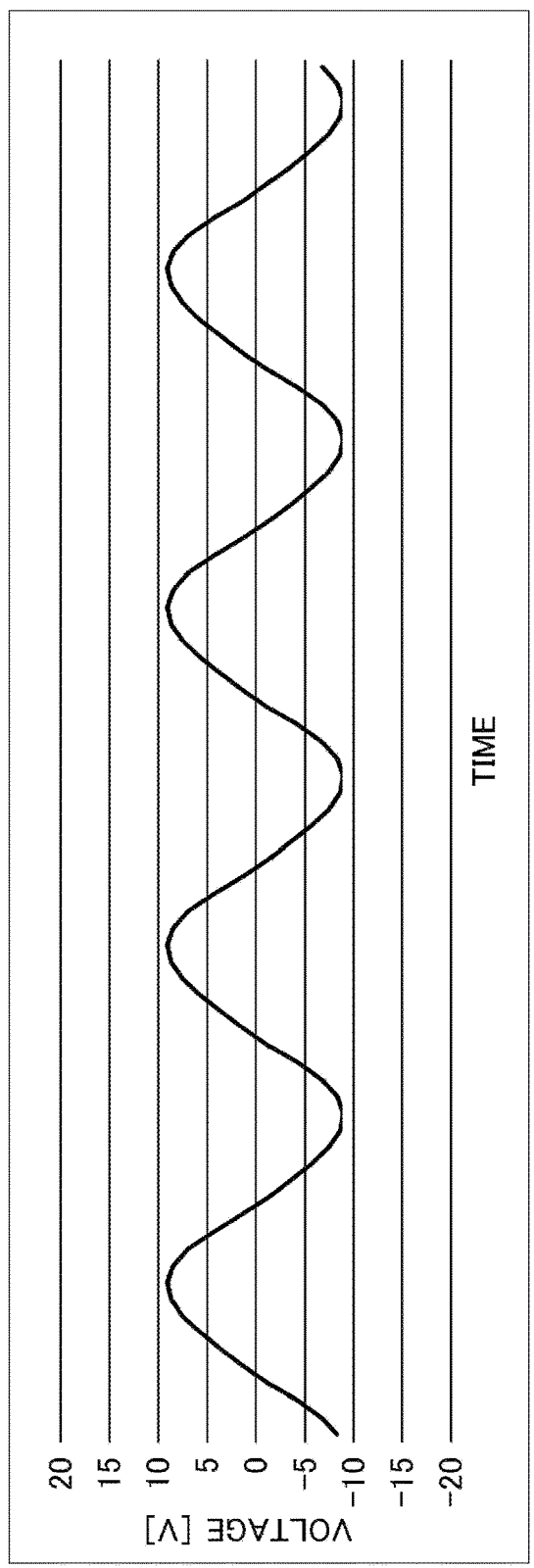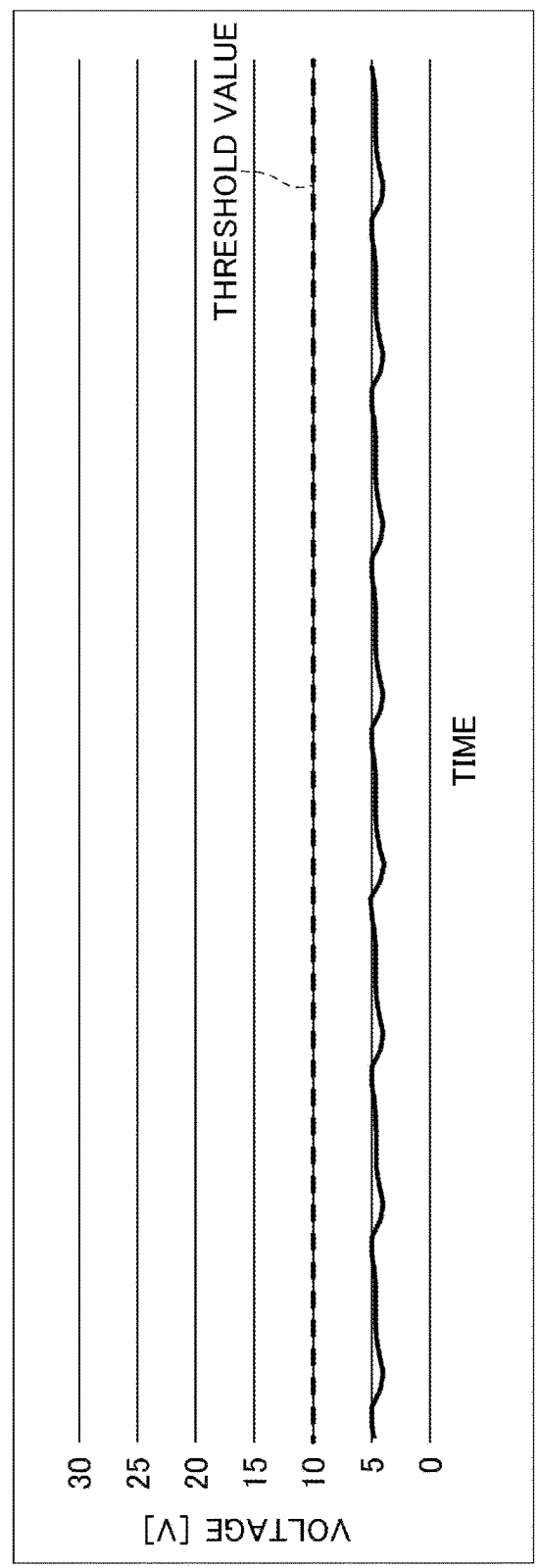

ABNORMALITY DETECTION METHOD AND ABNORMALITY DETECTION APPARATUS

CROSS-REFERENCE TO RELATED APPLICATIONS

This patent application is based upon and claims priority to Japanese Patent Application No. 2021-095890 filed on Jun. 8, 2021, the entire contents of which are incorporated herein by reference.

TECHNICAL FIELD

The present disclosure relates to an abnormality detection method and an abnormality detection apparatus.

BACKGROUND

A technique for smoothing an input waveform using a low pass filter to detect presence or absence of abnormalities is known (see, for example, Patent Document 1).

RELATED ART DOCUMENTS

Patent Documents

[Patent Document 1] Japanese Unexamined Patent Application Publication No. 2011-179849

SUMMARY

The present disclosure provides a technique for accurately detecting an abnormality in an alternating current (AC) signal.

An abnormality detection method according to one aspect of the present disclosure includes a method of detecting an abnormality in an AC signal to be input from an AC power supply. The method includes, where an ideal AC signal is represented as $V_0 \sin \omega t$ ($V_0$: amplitude, $\omega$: angular frequency, t: time), calculating an arithmetic value including a value represented by $\sin^2 \omega t + \cos^2 \omega t$ and determining that the AC signal is abnormal when the arithmetic value is out of a threshold range.

BRIEF DESCRIPTION OF THE DRAWINGS

FIG. 4A and FIG. 4B are waveform diagrams illustrating an example of an AC signal with large distortion; and FIG. 5A and FIG. 5B are waveform diagrams illustrating an example of an AC signal with small distortion.

DETAILED DESCRIPTION OF EMBODIMENTS

Figure 1:
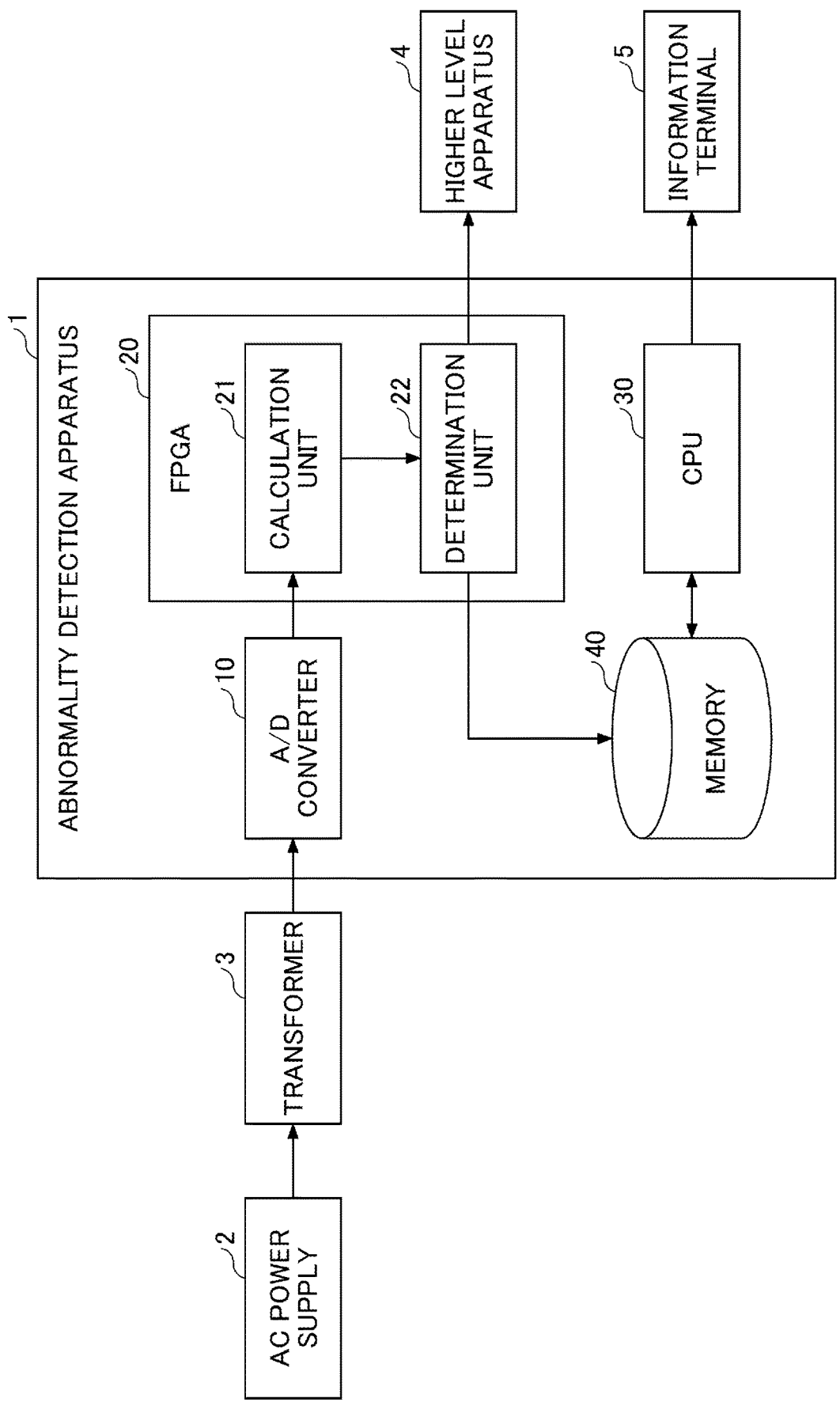
FIG. 1 is a block diagram illustrating an example of an abnormality detection apparatus according to an embodiment.

Hereinafter, non-limiting exemplary embodiments of the present disclosure will be described with reference to the accompanying drawings. In all the accompanying drawings, the same or corresponding reference numerals shall be attached to the same or corresponding components and overlapping descriptions may be omitted.

<Abnormality Detection Apparatus>

An example of an abnormality detection apparatus according to an embodiment will be described with reference to FIG. 1. An abnormality detection apparatus 1 according to an embodiment is an apparatus having a high-speed sampling function that enables sampling at a sampling frequency of several kHz or more. The abnormality detection apparatus 1 includes an A/D converter 10, a Field Programmable Gate Array (FPGA) 20, a Central Processing Unit (CPU) 30, a memory 40, or the like.

The A/D converter 10 converts an analog signal output by an AC power supply 2, that is stepped down to a predetermined voltage, by a transformer 3 into a digital signal according to a predetermined sampling frequency. The converted digital signal is input into the FPGA 20. The AC power supply 2 is a commercial power supply that outputs an AC signal of, for example, 50 Hz/60 Hz, 100 V/200 V. The predetermined voltage is, for example, 1 V to 10 V. The sampling frequency is, for example, 1 kHz.

The FPGA 20 includes a calculation unit 21, a determination unit 22, or the like as a functional unit. The calculation unit 21 calculates a DC voltage value based on the digital signal input from the A/D converter 10. The method of calculating the DC voltage value will be described later. The calculation process by the FPGA 20 is a hardware process and can be performed in real-time because delay does not readily occur. The determination unit 22 determines whether the DC voltage value calculated by the calculation unit 21 is out of the threshold range. When the DC voltage value calculated by the calculation unit 21 is out of the threshold range, the determination unit 22 determines that the AC signal output by the AC power supply 2 is abnormal and outputs an alarm signal to a higher level apparatus 4. The higher level apparatus 4 is, for example, a host computer. Further, the determination unit 22 stores time-series data including the value of the digital signal and the DC voltage value before and after the time at which the AC signal output from the AC power supply 2 is determined to be abnormal in the memory 40. The time-series data includes, for example, a waveform diagram.

The CPU 30 calculates a statistic for a predetermined period of time with respect to the time-series data stored in the memory 40. The statistic includes maximum value, minimum value, mean, variance, standard deviation, a coefficient of variation, or the like. The CPU 30 stores the calculated statistic in the memory 40. The CPU 30 outputs the calculated statistic to an information terminal 5 connected via a network such as a local area network (LAN). The information terminal 5 is, for example, a stationary or portable computer terminal, a mobile terminal such as a tablet and a smartphone, or the like.

The memory 40 stores various data (for example, time-series data) calculated by the FPGA 20 and various data (for example, the statistic) calculated by the CPU 30.

<Abnormality Detection Method>

Figure 2:
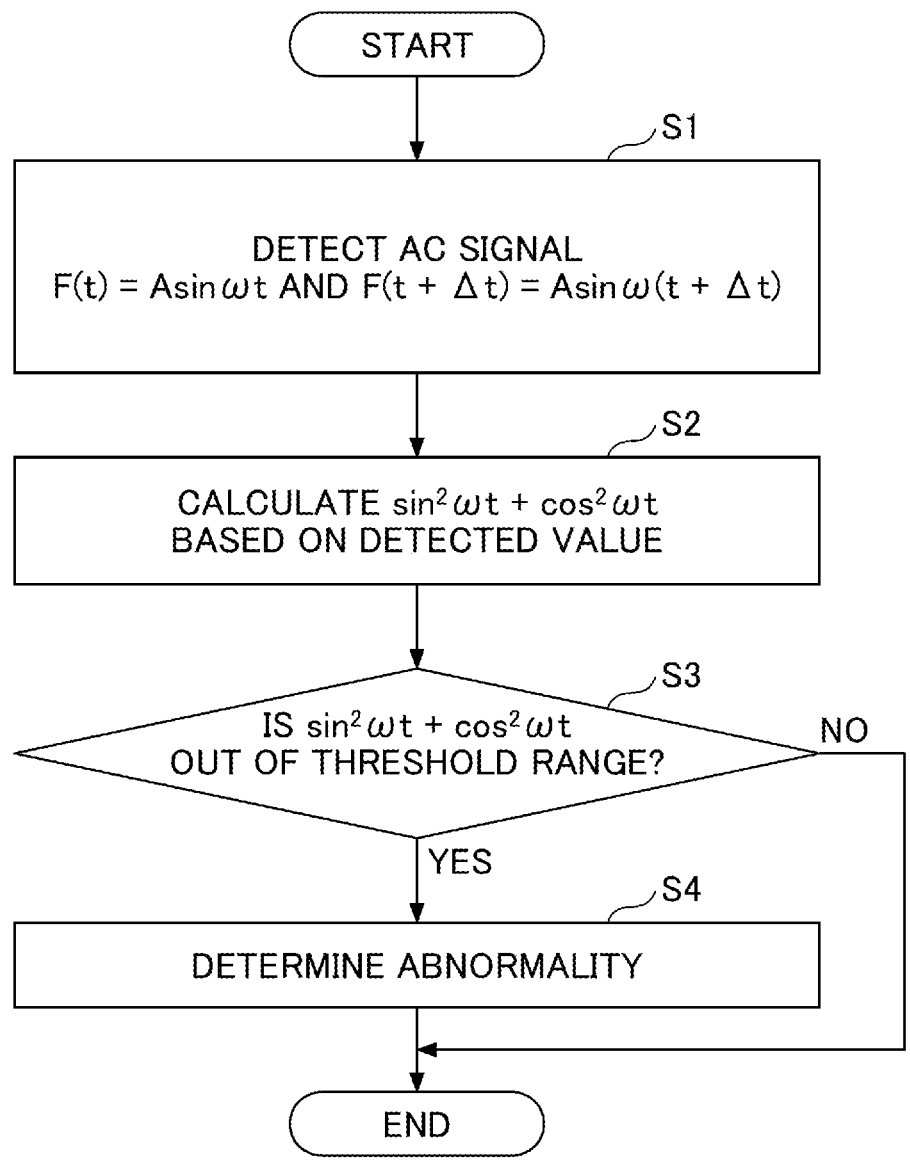
FIG. 2 is a flowchart illustrating an example of an abnormality detection method according to an embodiment.
Figure 3:
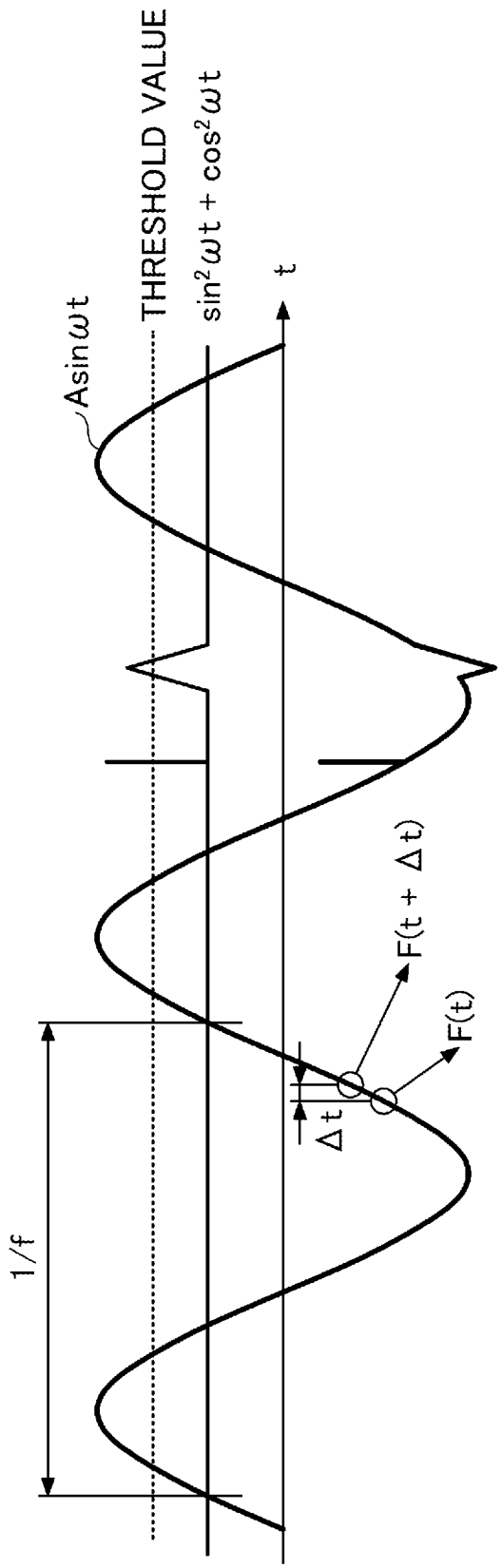
FIG. 3 is a waveform diagram for explaining an example of the abnormality detection method according to the embodiment.

An example of an abnormality detection method according to an embodiment will be described with reference to FIG. 2 and FIG. 3. Hereinafter, an ideal AC signal input from the AC power supply will be represented as $V_0 \sin \omega t$ ($V_0$: amplitude, $\omega$: angular frequency, t: time). In the abnormality detection method according to the embodiment, the abnormality detection apparatus 1 obtains the AC signal value input from the AC power supply 2 with a predetermined sampling period $\Delta t$ (sampling frequency $f_s=1/\Delta t$) and performs the detection in real-time. The AC signal is a signal input into a heater, such as a piping heater, chamber heater, or the like, included in a semiconductor manufacturing apparatus.

In step S1, the abnormality detection apparatus 1 detects an AC signal value F(t) at time t and an AC signal value F(t+Δt) at time t+Δt. F(t) and F(t+Δt) are represented by Math (1) and Math (2), respectively, where the amplitude is A and the angular frequency is ω.

$$F(t)=A \sin \omega t \quad (1)$$

$$F(t+\Delta t)=A \sin \omega(t+\Delta t) \quad (2)$$

In step S2, the abnormality detection apparatus 1 calculates a value represented by $\sin^2 \omega t + \cos^2 \omega t$ based on F(t) and F(t+Δt) detected in step S1. Sin ωt and cos ωt are calculated by the following calculations.

By transforming Math (1), following Math (3) can be obtained. That is, sin ωt is calculated based on the AC signal value F(t) at time t.

$$\sin \omega t = F(t)/A \quad (3)$$

By taking the difference between Math (1) and Math (2), following Math (4) is obtained.

$$F(t+\Delta t)-F(t)=A\{\sin \omega(t+\Delta t)-\sin \omega t\} \quad (4)$$

By transforming Math (4) with the addition theorem of trigonometric functions, following Math (5) is obtained.

$$F(t+\Delta t)-F(t)=A(\sin \omega t \cos \omega \Delta t + \sin \omega \Delta t \cos \omega t - \sin \omega t) \quad (5)$$

By transforming Math (5), following Math (6) is obtained. That is, cos ωt is calculated based on the AC signal value F(t) at time t and the AC signal value F(t+Δt) at time t+Δt.

$$\cos \omega t = \{(F(t+\Delta t)-F(t))/A \sin \omega \Delta t\} - \{(\sin \omega t (\cos \omega \Delta t - 1))/\sin \omega \Delta t\} \quad (6)$$

In Math (3) and Math (6), the angular frequency ω(=2πf) is known because the frequency f of the AC signal is known. In Math (6), the sampling period Δt is known as a predetermined value.

In step S3, the abnormality detection apparatus 1 determines whether the value represented by $\sin^2 \omega t + \cos^2 \omega t$ calculated in step S2 is out of the range of the abnormality value. The threshold value is set in advance by a user. The threshold value may include the upper and lower limits and may include only the upper limit. In step S3, when the value represented by $\sin^2 \omega t + \cos^2 \omega t$ calculated in step S2 is determined to be out of the threshold range, the abnormality detection apparatus 1 proceeds to step S4. On the other hand, when the value represented by $\sin^2 \omega t + \cos^2 \omega t$ calculated in step S2 is determined to be within the threshold range, the abnormality detection apparatus 1 terminates the process.

In step S4, the abnormality detection apparatus 1 determines that the AC signal input from the AC power supply 2 is abnormal and terminates the process.

According to the abnormality detection method of the embodiment described above, the value represented by $\sin^2 \omega t + \cos^2 \omega t$ is calculated based on the AC signal value input from the AC power supply 2, and when the calculated value is out of the threshold range, the AC signal is determined to be abnormal. The value represented by $\sin^2 \omega t + \cos^2 \omega t$ is constant when the waveform of the AC signal is close to an ideal sine wave, but varies greatly when the waveform of the AC signal is distorted. Therefore, it is easy to set a threshold value for determining whether the AC signal is abnormal, and the abnormality of the AC signal can be detected with high accuracy. On the other hand, if the AC signal is determined to be abnormal when the AC signal exceeds the threshold value, which is set with respect to the AC signal, it is difficult to set the threshold value, so that the abnormality of the AC signal may not be detected accurately. Abnormalities of the AC signal include stepped zero crossing, zero crossing distortion, transient overvoltage, white noise, voltage dip (voltage sag), frequency variation, instantaneous voltage drop, or the like.

Further, according to the abnormality detection method of the embodiment, the abnormality detection apparatus 1 obtains the AC signal value input from the AC power supply 2 with a predetermined sampling period Δt, and determines the abnormality of the AC signal in real-time based on the obtained value. Therefore, the abnormality of the AC signal can be detected at the same time or substantially at the same time as the abnormality detection apparatus 1 obtains the AC signal value.

In the abnormality detection method of the embodiment, the abnormality detection apparatus 1 may calculate a statistic, in a predetermined period, with respect to the AC signal value F(t) detected by the sampling period Δt and the value represented by $\sin^2 \omega t + \cos^2 \omega t$ calculated by the sampling period Δt. The statistic includes maximum value, minimum value, mean, variance, standard deviation, a coefficient of variation, or the like. The abnormality detection apparatus 1 may store the calculated statistic in the memory 40.

Further, in the abnormality detection method of the embodiment, the abnormality detection apparatus 1 may store time-series data including the AC signal value F(t) and the value represented by $\sin^2 \omega t + \cos^2 \omega t$ before and after the time the AC signal is determined to be abnormal in the memory 40. The time-series data includes, for example, a waveform diagram.

Further, in the abnormality detection method of the embodiment, when the AC signal input from the AC power supply 2 is determined to be abnormal, the abnormality detection apparatus 1 may output an alarm signal to the outside. When the AC signal input from the AC power supply 2 is determined to be abnormal, the abnormality detection apparatus 1 may stop the operation of the semiconductor manufacturing apparatus including a heater in which the AC signal is to be input.

Further, in the abnormality detection method of the embodiment, the case where the abnormality detection apparatus 1 determines the abnormality of the AC signal based on the value represented by $\sin^2 \omega t + \cos^2 \omega t$ is described, but is not limited thereto. For example, the abnormality detection apparatus 1 may determine the abnormality of the AC signal based on the DC voltage (effective converted value) represented by $\{A^2(\sin^2 \omega t + \cos^2 \omega t)/2\}^{1/2}$. As described above, the abnormality detection apparatus 1 determines an abnormality of the AC signal based on an arithmetic value including the value represented by $\sin^2 \omega t + \cos^2 \omega t$.

EXAMPLE

With reference to FIG. 4 and FIG. 5, the results of calculating the DC voltage (effective converted value) represented by $\{A^2(\sin^2 \omega t + \cos^2 \omega t)/2\}^{1/2}$ will be described with respect to the AC signal with small distortion and the AC signal with large distortion, respectively, according to the abnormality detection method of the embodiment.

FIG. 4A is a waveform diagram of the AC signal output by the AC power supply 2 (50 Hz, 200 V) and stepped down by the transformer 3. FIG. 4B is a waveform diagram of the DC voltage calculated based on the AC signal illustrated in the waveform diagram of FIG. 4A. In FIG. 4A and FIG. 4B, the horizontal axis represents time and the vertical axis represents voltage [V].

When the distortion of the AC signal is large (see FIG. 4A), as illustrated in FIG. 4B, it can be seen that the DC voltage calculated based on the AC signal varies significantly at the time when the transient overvoltage is generated. Therefore, by setting a value greater than the effective voltage of the AC signal (for example, 10 V) as the threshold value, an abnormality of the AC signal can be determined to have occurred at the time when the transient overvoltage occurred.

FIG. 5A is a waveform diagram of the AC signal output by the AC power supply 2 (50 Hz, 200 V) and stepped down by the transformer 3. FIG. 5B is a waveform diagram of the DC voltage calculated based on the AC signal illustrated in the waveform diagram of FIG. 5A. In FIG. 5A and FIG. 5B, the horizontal axis represents time and the vertical axis represents voltage [V].

When the distortion of the AC signal is small (see FIG. 5A), as illustrated in FIG. 5B, it can be seen that the DC voltage calculated based on the AC signal is stable near the effective voltage. Therefore, by setting a value greater than the amplitude of the AC signal (for example, 10 V) as the threshold value, it can be determined that no abnormality occurs in the AC signal.

The embodiments disclosed herein should be considered to be exemplary in all respects and not restrictive. The above embodiments may be omitted, substituted, or modified in various forms without departing from the appended claims and spirit thereof.

In the above-described embodiments, the case in which the calculation unit 21 and the determination unit 22 are implemented by the FPGA has been described, but the present disclosure is not limited thereto. For example, the calculation unit 21 and the determination unit 22 may be implemented in another hardware such as an Application Specific Integrated Circuit (ASIC).

Further, although the above-described embodiments have been described in which the AC signal is a signal to be input to a heater included in the semiconductor manufacturing apparatus, the present disclosure is not limited thereto. For example, the AC signal may be a signal that is to be input to a high frequency power supply for plasma generation included in the semiconductor manufacturing apparatus.

What is claimed is:

1. A computer-implemented abnormality detection method that detects an abnormality in an AC signal to be input from an AC power supply into a device included in a semiconductor manufacturing apparatus, the method comprising:
where an ideal AC signal is represented as $V_0 \sin \omega t$ ($V_0$: amplitude, $\omega$: angular frequency, t: time),
calculating an arithmetic value including a value represented by $\sin^2 \omega t + \cos^2 \omega t$;
determining that the AC signal is abnormal when the arithmetic value is out of a threshold range, and
stopping an operation of the semiconductor manufacturing apparatus in response to determining that the AC signal is abnormal.

2. The abnormality detection method according to claim 1, further comprising:
detecting a value of the AC signal at time t and time t+Δt, wherein the arithmetic value is calculated based on the detected value of the AC signal.

3. The abnormality detection method according to claim 2, wherein the calculating the arithmetic value further includes:
calculating sin ωt based on the value of the AC signal at time t; and
calculating cost based on the value of the AC signal at time t and time t+Δt.

4. The abnormality detection method according to claim 1, further comprising calculating a statistic of the arithmetic value for a predetermined period of time.

5. The abnormality detection method according to claim 1, wherein the AC signal includes a signal to be input into a heater included in the semiconductor manufacturing apparatus.

6. The abnormality detection method according to claim 1, wherein the AC signal includes a signal to be input into a high frequency power supply for plasma generation included in the semiconductor manufacturing apparatus.

7. The abnormality detection method according to claim 1, further comprising storing, when the AC signal is determined to be abnormal, time-series data including a value of the AC signal and the arithmetic value, at a time of the AC signal being determined to be abnormal, and before and after the time of the AC signal being determined to be abnormal.

8. An abnormality detection apparatus that detects an abnormality in an AC signal to be input from an AC power supply into a device included in a semiconductor manufacturing apparatus, comprising:
a memory; and
a processor configured to:
where an ideal AC signal is represented as $V_0 \sin \omega t$ ($V_0$: amplitude, $\omega$: angular frequency, t: time),
calculate an arithmetic value including a value represented by $\sin^2 \omega t + \cos^2 \omega t$;
determine that the AC signal is abnormal when the arithmetic value is out of a threshold range, and
stop an operation of the semiconductor manufacturing apparatus in response to determining that the AC signal is abnormal.

9. The abnormality detection apparatus according to claim 8, wherein the processor is included in a Field Programmable Gate Array.

10. The abnormality detection apparatus according to claim 8, wherein the processor
calculates the arithmetic value in real-time; and
determines the abnormality in the AC signal in real-time.

* * * * *